US012731057B2

(12) United States Patent
Hassel et al.

(10) Patent No.: US 12,731,057 B2
(45) Date of Patent: Sep. 8, 2026

(54) QUANTUM COMPUTING CIRCUIT COMPRISING A PLURALITY OF CHIPS AND METHOD FOR MANUFACTURING THE SAME

(71) Applicant: IQM Finland Oy, Espoo (FI)

(72) Inventors: Juha Hassel, Espoo (FI); Wei Liu, Espoo (FI); Vasilii Sevriuk, Espoo (FI); Johannes Heinsoo, Espoo (FI); Mate Jenei, Espoo (FI); Manjunath Venkatesh, Espoo (FI); Tianyi Li, Espoo (FI); Kok Wai Chan, Espoo (FI); Kuan Yen Tan, Espoo (FI); Mikko Möttönen, Espoo (FI)

(73) Assignee: IQM Finland Oy, Espoo (FI)

( * ) Notice: Subject to any disclaimer, the term of this patent is extended or adjusted under 35 U.S.C. 154(b) by 1651 days.

(21) Appl. No.: 17/139,715

(22) Filed: Dec. 31, 2020

(65) Prior Publication Data

US 2022/0012617 A1 Jan. 13, 2022

(30) Foreign Application Priority Data

Jul. 9, 2020 (EP) .................................... 20185005

(51) Int. Cl.

| | |
|---|---|
| ***G06N 10/20*** | (2022.01) |
| ***G06N 10/40*** | (2022.01) |
| ***H10N 69/00*** | (2023.01) |
| *H10W 72/29* | (2026.01) |
| *H10W 90/00* | (2026.01) |

(52) U.S. Cl.

CPC ............ *G06N 10/20* (2022.01); *G06N 10/40* (2022.01); *H10N 69/00* (2023.02); *H10W 72/29* (2026.01); *H10W 90/722* (2026.01)

(58) Field of Classification Search

None

See application file for complete search history.

(56) References Cited

U.S. PATENT DOCUMENTS

2019/0229094 A1* 7/2019 White .................... H01L 24/81

FOREIGN PATENT DOCUMENTS

| | | | |
|---|---|---|---|
| CN | 109781947 | A | 5/2019 |
| CN | 109891591 | A | 6/2019 |
| CN | 110402446 | A | 11/2019 |
| CN | 213545321 | U | 6/2021 |
| EP | 3576142 | | 4/2019 |

(Continued)

OTHER PUBLICATIONS

Mykkanen et al.; "Thermionic junction devices utilizing phonon blocking"; Applied Sciences and Engineering, Research Article; Apr. 10, 2020; 9 pages.

(Continued)

*Primary Examiner* — Hung K Vu

(74) *Attorney, Agent, or Firm* — Meunier Carlin & Curfman LLC

(57) ABSTRACT

A quantum computing circuit is disclosed herein. An example quantum computing circuit includes a first chip with at least one qubit thereon. The quantum computing circuit also includes a second chip with at least other quantum circuit elements other than qubits thereon. The first chip and the second chip are stacked together in a flip-chip configuration and attached to each other with bump bonding that includes bonding bumps.

15 Claims, 6 Drawing Sheets

(56) References Cited

FOREIGN PATENT DOCUMENTS

| | | | | |
|---|---|---|---|---|
| WO | 2018169585 | | 9/2018 | |
| WO | 2019059879 | | 3/2019 | |
| WO | WO-2019236734 | A1 * | 12/2019 | ........... H01L 21/486 |
| WO | 2020027779 | | 2/2020 | |
| WO | WO-2020231378 | A1 * | 11/2020 | ............ G06N 10/00 |

OTHER PUBLICATIONS

Written Opinion issued to related PCT Application PCT/FI2021/050516, dated Sep. 2, 2022, 8 pages.
Office Action issued in CN App. No. 202011138243.3 mailed Sep. 27, 2024 (with English-language translation), 15 pages.
Binhui, Pan et al. "Expansibility and Tendency of the Quantum Computer," Science and Technology Plaza, No. 11., Nov. 30, 2010 (with English-language Abstract), 5 pages.
Das Rabindra et al: "Cryogenic Qubit Integration for Quantum Computing",2018 IEEE 68th Electronic Components and Technology Conference (ECTC), IEEE, May 29, 2018 (May 29, 2018), pp. 504-514, XP033380041, DOI: 10.1109/ECTC.2018.00080 [retrieved on Aug. 7, 2018].
Satzinger K J et al: "Simple non-galvanic flip-chip integration method for hybrid quantum systems", Applied Physics Letters, a IP Publishing LLC, US, vol. 114, No. 17, Apr. 29, 2019 (Apr. 29, 2019), XP012237442, ISSN: 0003-6951, DOI: 10.1063/1.5089888 [retrieved on Apr. 29, 2019].
Kuan Yen Tan et al: "Quantum Circuit Refrigerator", arxiv.org, Cornell University Library, 201 Olin Library Cornell University Ithaca, NY 14853, Jun. 15, 2016 (Jun. 15, 2016), XP081362891, DOI: 10.1038/NCOMMS15189.
International Search Report issued to PCT/FI2021/050516, dated Sep. 30, 2021, 7 pages.
Rosenberg et al, "Solid-State Qubits: 3D Integration and Packaging"; IEEE Microwave Magazine IEEE, Jul. 8, 2020, vol. 21, No. 8, XP011797742, <DOI:10.1109/MMM.2020.2993478>; 14 pages.

* cited by examiner

QUANTUM COMPUTING CIRCUIT COMPRISING A PLURALITY OF CHIPS AND METHOD FOR MANUFACTURING THE SAME

PRIORITY CLAIM

This application claims priority to European Patent Application No. 20185005.4, filed on Jul. 9, 2020, the entire disclosure of which is incorporated by reference herein.

TECHNICAL FIELD

The invention is generally related to quantum computing hardware. In particular, the invention is related to an advantageous structural solution of a quantum computing circuit.

BACKGROUND

Hardware used for quantum computing is based on superconducting chips. This term is generally used to mean a device in which a number of microscopic-scale circuit elements, at least some of which are made of superconductive material, are produced on a substrate using photolithography, micromachining, and/or other suitable methods. A quantum processor is a superconducting chip that comprises a selection of circuit elements, including one or more qubits, as well as their interconnections in an arrangement that enables using the one or more qubits for quantum computing operations.

Examples of circuit elements that may be needed in a quantum processor include but are not limited to qubits, resonators, couplers, qubit reset circuitry, semiconducting quantum dots, single-electron transistors, amplifiers, and others. Of these, the qubit reset circuitry may include, for example, quantum circuit refrigerators (QRSs). Whatever the exact composition of a quantum processor, it has been found that problems may arise from the various materials and processing steps that are required during its manufacturing process, as well as from unwanted interactions between the various circuit elements in the completed quantum processor.

As an example, a manufacturer may have a process that has been optimized to produce qubits of extremely high quality. It may turn out, however, that the process is not suitable for manufacturing more complicated superconducting chips such as quantum processors because some of the materials and/or process steps needed for the other circuit elements are incompatible with those needed for the qubits. The result is often a compromise in which the materials and/or process steps are reasonably suitable for all circuit elements, even if they may not be exactly optimal for any individual circuit element.

In another example, while the qubits and other circuit elements of a quantum processor may have a variety of desired interactions that are essential for quantum computing, they may also interact in undesired ways that cause dissipation and shorten the coherence time of the qubit states. Such a phenomenon is a source of quantum information loss.

There exists a clear need for solutions in circuit design and manufacturing methods for quantum computing circuits that would enable better optimization of the materials, process steps, and/or circuit operation.

SUMMARY

A quantum computing circuit and a method for its manufacturing are disclosed herein. The example quantum computing circuit and the related manufacturing processes enable optimization of the materials and/or process steps involved for different types of circuit elements. The example quantum computing circuit and the related manufacturing processes also enable achieving optimal performance of all or at least a majority of circuit elements in a quantum computing circuit.

The objectives of the invention are achieved using a flip-chip approach in which circuit elements, the manufacturing and/or operation of which together could involve incompatible aspects, are manufactured on separate chips, which are subsequently attached together in a sandwiched configuration.

According to a first aspect there is provided a quantum computing circuit that includes a first chip, with at least one qubit thereon, and a second chip, with at least other quantum circuit elements other than qubits thereon. The first chip and the second chip are stacked together in a flip-chip configuration and attached to each other via bump bonding that includes bonding bumps.

According to an embodiment, the first chip is made of a first set of constituent materials and the second chip is made of a second set of constituent materials. In such a case, the first and second sets consist of at least partly different constituent materials. This embodiment provides an advantage in fabricating qubits by avoiding materials that might cause disadvantageous contamination of the qubits.

According to an embodiment, the second set of constituent materials includes at least one material that is not present in the first set of constituent materials and is one of: aluminum oxide, copper, palladium, or another non-superconductive metal. This embodiment provides an advantage by avoiding material contamination of qubits.

According to an embodiment, the first chip is manufactured in a first manufacturing process that consists of a first sequence of manufacturing steps, and the second chip is manufactured in a second manufacturing process that consists of a second sequence of manufacturing steps. The first and second sequences may be at least partly different sequences of manufacturing steps. This embodiment provides an advantage by avoiding the subjection of the qubit(s) to manufacturing steps that are not needed for manufacturing the qubit(s) and could cause harmful effects to the qubit(s).

According to an embodiment, at least some of the bonding bumps are galvanically conductive and constitute galvanically conductive contacts between the first and second chips. This embodiment provides an advantage by enabling signal lines to be routed to and from the first and second chips and/or ground planes and other conductive constructions to be connected together between the first and second chips.

According to an embodiment, one of the first and second chips is a larger chip and the other of the first and second chips is a smaller chip that covers only a part of the larger chip in the flip-chip configuration. This embodiment provides an advantage by enabling the exposed area of the larger chip to be used for making connections to and from the quantum computing circuit.

According to an embodiment, the larger chip includes at least a first contact pad on that part of its surface facing the smaller chip that is not covered by the smaller chip. The larger chip may then include a first connection connecting the first contact pad and a first galvanically conductive bonding bump. The smaller chip may include a second connection connecting the first galvanically conductive bonding bump and a first quantum circuit element on the smaller chip. The first contact pad may constitute a signal connection to the first quantum circuit element. This embodiment provides an advantage by enabling signal connections to components on the smaller chip to be made through contact pads on the larger chip.

According to an embodiment, the smaller chip includes a second contact pad on its surface facing away from the larger chip, and a third connection through a first conductive via. The third connection connects the second contact pad to a second quantum circuit element on the surface of the smaller chip that faces the larger chip. This embodiment provides an advantage by enabling signal connections to components on the smaller chip to be made through contact pads on the exposed surface of the smaller chip.

According to an embodiment, the larger chip includes a second conductive via that connects a third quantum circuit element on that part of the surface of the larger chip facing the smaller chip that is covered by the smaller chip to a fourth connection that is at least partly located on the surface of the larger chip facing away from the smaller chip. This embodiment provides an advantage by enabling signal connections to be made in a very effective way to components on any one of the chips located within the area where the chips overlap.

According to an embodiment, the quantum computing circuit includes a non-galvanic connection for conveying signals between the first and second chips. The non-galvanic connection includes matching non-galvanic connector structures on the surfaces of the first and second chips facing each other. This embodiment is advantageous by providing a large degree of control over the ways in which the components on the two chips are coupled to each other.

According to an embodiment, the matching non-galvanic connector structures include mutually aligned conductive areas on the surfaces of the first and second chips facing each other for making a capacitive connection. This embodiment provides an advantage by enabling the properties of the corresponding connection, including e.g. inherent filtering capability, to be tuned by selecting the capacitance of the capacitive connection appropriately.

According to an embodiment, the matching non-galvanic connector structures include mutually aligned inductive elements for making a magnetic connection. This embodiment provides an advantage by enabling the properties of the corresponding connection, including e.g. inherent filtering capability, to be tuned by selecting the inductance of the magnetic connection appropriately.

According to an embodiment, the second chip includes a quantum circuit refrigerator. The quantum computing circuit may include a controllable connection between the quantum circuit refrigerator and at least one qubit on the first chip for allowing the quantum circuit refrigerator to be controllably used to reset a state of the at least one qubit. This embodiment provides an advantage by enabling the manufacturing of the qubit(s) and the quantum circuit refrigerator(s) to be kept separate from each other, so that both can be optimized without causing disadvantageous effects to the other.

According to an embodiment, the second chip includes at least one filter that comprises at least one of a non-superconductive metal, or a lossy dielectric. This embodiment provides an advantage by enabling the method steps and materials that are needed to fabricate filters to be kept from compromising the quality of the qubit(s).

According to an embodiment, the separating distance between the first and second chips is between 1 and 100 micrometers. This embodiment is advantageous by enabling the distance to provide a desired role in any non-galvanic connections that may be made between the two chips.

According to a second aspect, there is provided a method for producing a quantum computing circuit. The method includes manufacturing a first chip and and producing at least one qubit on the first chip. The method also includes manufacturing a second chip and producing at least one quantum circuit element other than a qubit on the second chip. The method further includes bump bonding the first and second chips together into a stacked configuration using bonding bumps to attach the first and second chips to each other.

According to an embodiment, the method further includes using a first set of materials in manufacturing the first chip and using a second set of materials in manufacturing the second chip so that the first and second sets consist of at least partly different materials. This embodiment provides an advantage by enabling the qubits to be fabricated by avoiding materials that might cause disadvantageous contamination of the qubits.

According to an embodiment, the method further includes using a first manufacturing process to manufacture the first chip, where the first manufacturing process consists of a first sequence of manufacturing steps. The method also includes using a second manufacturing process to manufacture the second chip, where the second manufacturing process consists of a second sequence of manufacturing steps. The first and second sequences are at least partly different sequences of manufacturing steps. This embodiment provides an advantage by avoiding the subjection of the qubit(s) to manufacturing steps that are not needed for manufacturing the qubit(s) and could cause harmful effects to the qubit(s).

According to an embodiment, the method further includes making the bump bonding attach the first and second chips to each other at a separating distance selected for optimized non-galvanic signal coupling between circuit elements on the first and second chips. This embodiment is advantageous by enabling the distance to provide a desired role in any non-galvanic connections that may be made between the two chips.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 1:
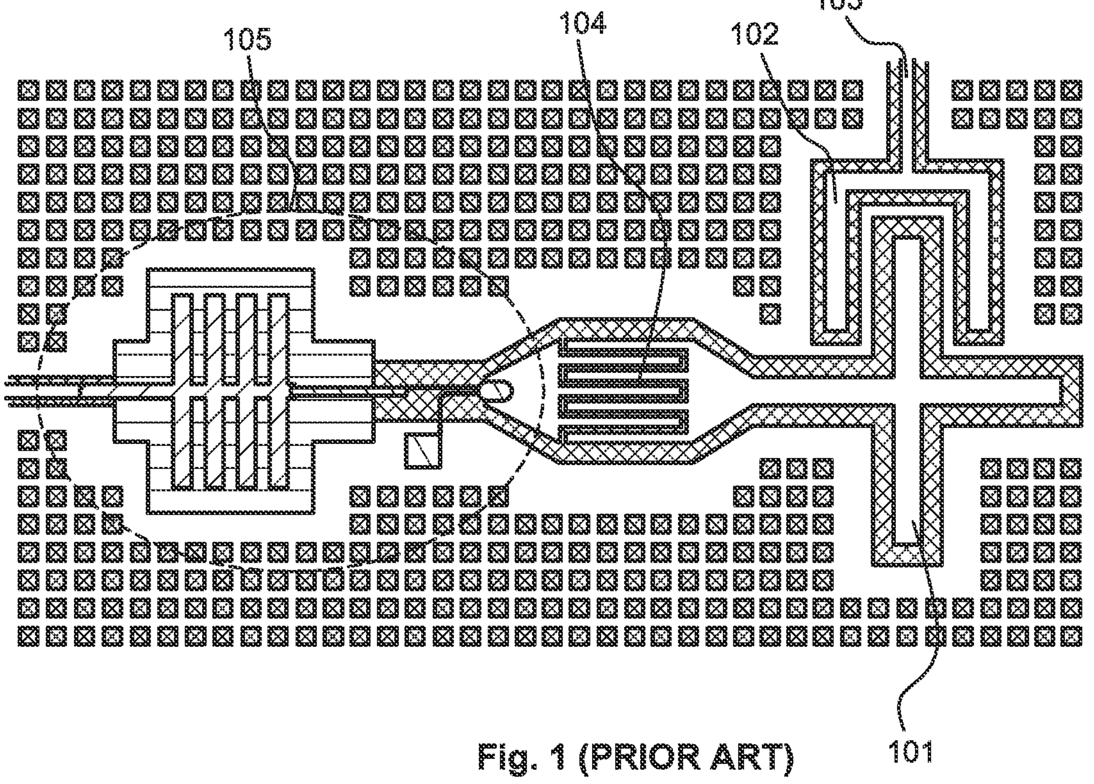
FIG. 1 illustrates a part of a known quantum processor.
Figure 2:
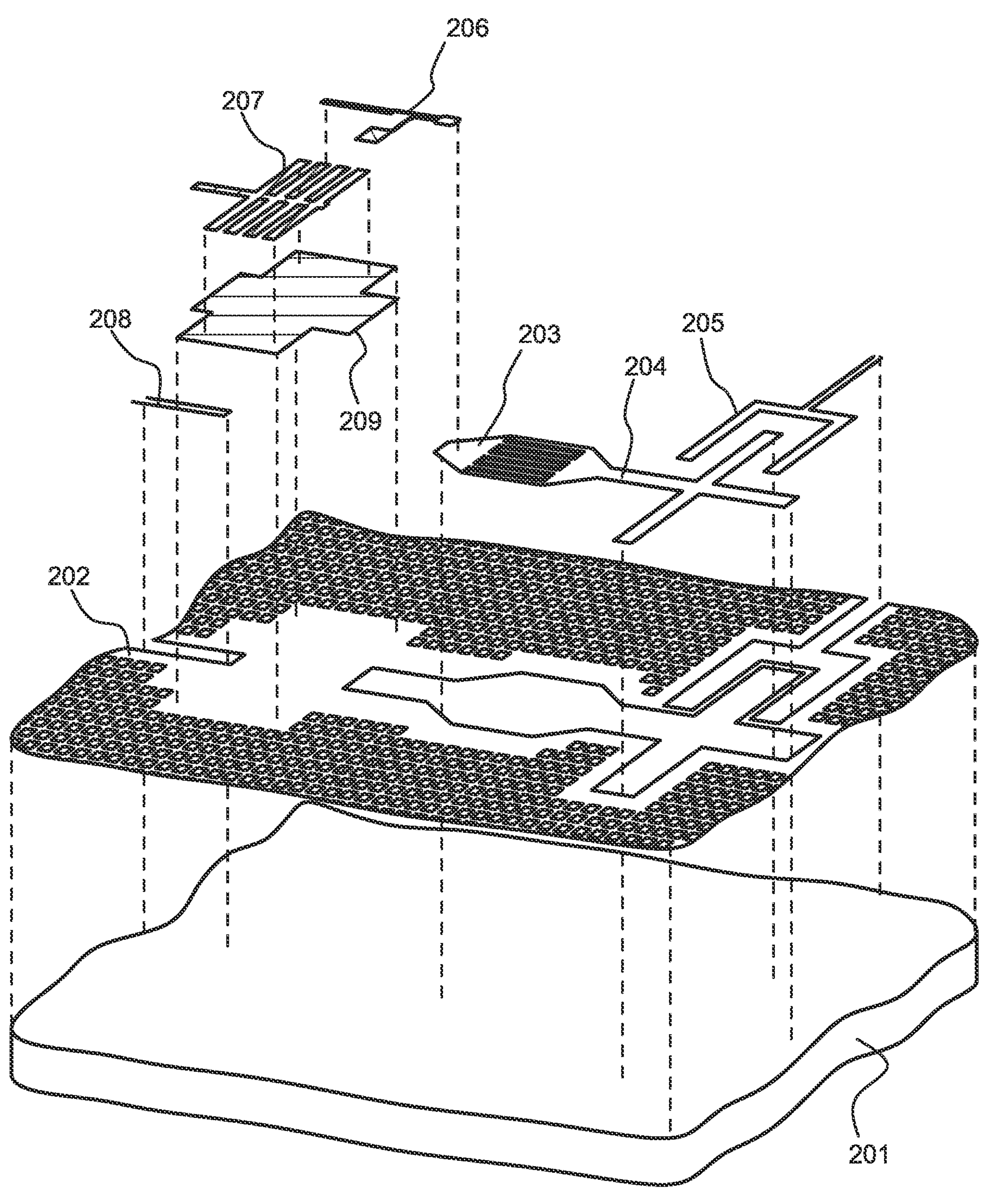
FIG. 2 illustrates an exploded view of the part shown in FIG. 1.

FIG. 1 illustrates schematically a part of a known quantum computing circuit shown from above. The quantum computing circuit may be, for example, a quantum processor. FIG. 2 is an exploded view that shows how the patterns shown in FIG. 1 may be constructed on the surface of a dielectric substrate 201. Both FIG. 1 and FIG. 2 are simplified for the purpose of graphical clarity, but the following explanation is applicable to also more complete corresponding structures. Cross-hatched portions in FIG. 1 illustrate areas where the surface of the substrate is visible between the patterns made of substances of desired degree of conductivity and/or superconductivity.

The X-formed or plus-sign-formed part 101 is a qubit of the transmon type. The simplification made here involves e.g. not showing a nonlinear inductance component of the qubit that could appear e.g. as a Josephson junction and/or SQUID (Superconductive QUantum Interference Device) at the end of one of the branches shown herein. A fork-like structure 102 around one of the branches is a capacitive coupling element, from which a transmission line 103 may lead to some other part of the quantum computing circuit. Intertwined fingers 104 constitute another capacitive coupling element, from which there is a connection to a qubit reset circuit 105, which here is a quantum circuit refrigerator (QCR). As such, the QCR could also be coupled to the capacitive coupling element 102 instead of being coupled directly to the qubit 101.

FIG. 2 shows how most of the surface of the substrate is covered by the superconductive ground plane 202, in which the small, square openings serve to prevent the occurrence of unwanted eddy currents. The patterns shown as 203, 204, and 205 are also made of a superconductive material, which as a characterization means a material that becomes superconductive at low temperatures at which the quantum computing circuit is to be used.

The part shown as 206 comprises a SINIS junction needed in the QCR, as well as the contact pad through which the QCR makes a connection to the ground plane. Part 207 is a part of a microwave filter, and part 208 forms a transmission line through which a control signal may be brought to the QCR. A dielectric layer 209 is needed between the ground plane 202 and the conductive part 207 to form a capacitor as a part of the microwave filter.

Processes and designs for manufacturing high-quality qubits are known, and they have typically been optimized so that the produced qubits have a long coherence time and other advantageous characteristics. Manufacturing a structure like that shown in FIGS. 1 and 2, in particular the parts of the QCR, may require a different kind of process. The difference may include different process steps, different order of process steps, different materials, different process parameters such as temperatures, pressures, and/or durations, and the like. For example, manufacturing the SINIS junction in the QCR involves using one or more materials, i.e. normal metal(s) and insulator(s), which are not needed in the manufacture of qubit(s). Similarly the insulating layer 209 may comprise a material that would not appear in the manufacturing process of just one or more qubits. All these differences in materials and/or process steps may lead to the disadvantageous consequences discussed above in the background section.

Figure 3:
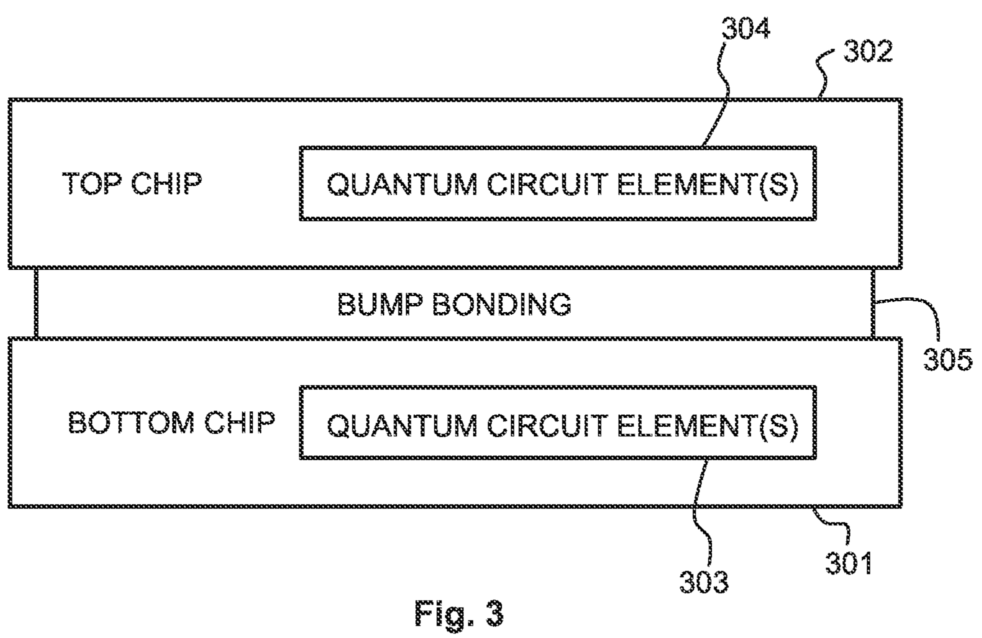
FIG. 3 illustrates a principle of a quantum computing circuit that includes a sandwiched configuration of two chips.

FIG. 3 illustrates schematically a quantum computing circuit in which the above-disadvantageous consequences can be at least partly avoided. The quantum computing circuit of FIG. 3 includes a first chip 301 and a second chip 302. Both chips have one or more quantum circuit elements built on them. The quantum circuit element(s) on the first chip 301 are schematically shown as 303, and the quantum circuit elements on the second chip 302 are schematically shown as 304. Based on their appearance in FIG. 3, the first chip 301 may also be called the bottom chip and the second chip 302 may be called the top chip.

One of the first and second chips is the qubit chip. Without losing generality it may be assumed herein that the first chip 301 has at least one qubit included in the quantum circuit elements 303. The second chip 302 has at least one quantum circuit element other than a qubit included in its quantum circuit elements 304. In an advantageous embodiment, the second chip 302 has no qubits included in its quantum circuit elements 304 so that all qubits of the quantum computing entity consisting of the first and second chips 301 and 302 are included in the quantum circuit elements 303 of the first chip 301. With reference to the description of FIGS. 1 and 2 it may be assumed that the manufacturing process used to manufacture the first chip 301 differs from that used to manufacture the second chip 302. The manufacturing difference is a direct consequence of the fact that there is at least one quantum circuit element other than a qubit included in the quantum circuit elements 304 of the second chip 302.

In this approach, the qubit chip 301 will not experience the manufacturing process of the QCR and/or other non-qubit circuit elements located on the other chip 302, and will not have direct contact to the materials involved in the fabrication of the QCR and/or other non-qubit circuit elements. In that sense, the qubit is 'pristine' and can be manufactured with the standard process which is known to produce high quality qubits and long coherence time. In addition, this manufacturing technique can minimize the contact of dissipatine components with the qubit chip.

An example of a manufacturing step that may be used to fabricate known quantum circuit elements, but that is disadvantageous to any qubit located on the same chip as such another quantum circuit element is baking. As discussed herein, baking includes the application of high temperature in order to, for example, cure a layer of resist. Resists are used in photolithographic manufacturing methods to define how various patterns will be formed on a surface of the chip. For example, the junctions of qubits and QCRs both require baking during their fabrication, but since the materials involved are different, both require at least one baking step of their own. On the other hand, any subjecting to high temperature is known to accelerate the disadvantageous aging of any such junction. Thus, if a qubit and a QCR are fabricated on the same chip, whichever of their respective junctions is made first, it will experience disadvantageous accelerated aging during the baking step(s) needed to subsequently fabricate the other junction.

Another example of a manufacturing step that may be needed to fabricate another quantum circuit element but that is disadvantageous to any qubit located on the same chip is etching. For example, when a microwave filter is fabricated, a layer of dielectric material is needed, like aluminum oxide for example. After the deposition of an aluminum oxide layer, etching is used to remove the aluminum oxide from those parts of the chip surface where it is not needed. Etching may create surface roughness at the qubit region, which may impede the optimal performance that the qubit might otherwise achieve.

Additionally, any step of a manufacturing method that involves using a material that would not be needed to manufacture just the qubit(s) may be disadvantageous to any qubit located on the same chip. Any such step may cause contamination, which in this framework means unwanted appearance of material residues at or close to the qubit region in the completed chip. Contaminating materials may include materials that are actually needed at other parts of the quantum computing circuit, such as non-superconductive metals and dielectric substances, and/or materials that are only needed during manufacturing such as resists.

The first chip 301 and the second chip 302 of FIG. 3 are stacked together in a flip-chip configuration and attached to each other with bump bonding 305 that comprises bonding bumps. A flip-chip configuration of two chips is sometimes referred to as (one form of) three-dimensional integration of circuits. Producing the flip-chip configuration involves using a special machine, known as a flip-chip bonder, to place bonding bumps at selected locations on the surface of at least one of the chips and to then press the chips together, applying a predetermined temperature and pressing force. This causes partial deformation of the bonding bumps and attaches the chips to each other. If some or all of the bonding bumps are made of an electrically conductive (or superconductive) material, and if they are placed at locations where mutually aligned conductive (or super-conductive) patterns exist on the surfaces of both chips, they can be used to make electric connections of desired kind between the chips.

The difference between the manufacturing processes of the two chips 301 and 302 may be, for example, such that the first chip 301 is made of a first set of constituent materials, the second chip 302 is made of a second set of constituent materials, and the first and second sets consist of at least partly different constituent materials. Assuming that the first chip 301 comprises the qubit(s) and the second chip 302 comprises at least some other quantum circuit elements other than qubits, the second set of constituent materials may comprise at least one material that is not present in the first set of constituent materials, like aluminum oxide, copper, palladium, and/or any other non-superconductive metal. In general, the at least one material that is not present in the first set of constituent materials is a material that is fundamentally not compatible with the aim of optimizing the manufacturing process and later operative use of qubits.

Additionally or alternatively, the difference between the manufacturing processes of the two chips 301 and 302 may be in the steps of their manufacturing processes. The first chip 301 may be manufactured in a first manufacturing process that consists of a first sequence of manufacturing steps, and the second chip 302 may be manufactured in a second manufacturing process that consists of a second sequence of manufacturing steps. These first and second sequences are then at least partly different sequences of manufacturing steps. In particular, the second sequence may involve one or more manufacturing steps that by their nature would be disadvantageous in producing qubits of the highest possible quality. Additionally or alternatively, the second sequence may lack one or more manufacturing steps that are essential in producing qubits of the highest possible quality. Additionally or alternatively, the second sequence may involve one or more manufacturing steps in which the selected value of a process parameter, such as a temperature, pressure, or duration, for example, may be disadvantageous in producing qubits of the highest possible quality.

Figure 4:
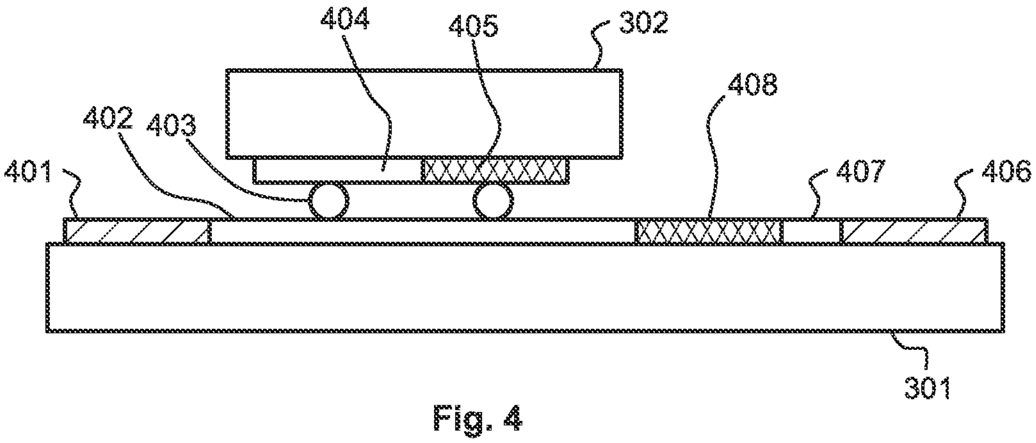
FIG. 4 illustrates an example of applying the principle of FIG. 3.
Figure 5:
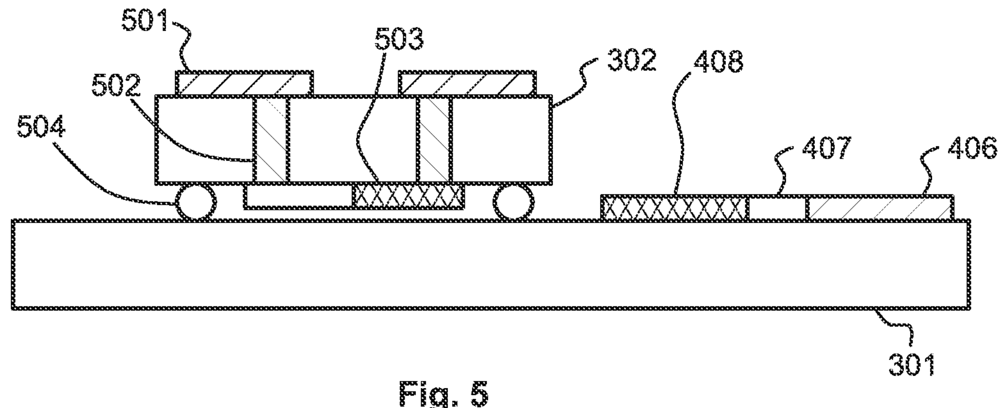
FIG. 5 illustrates another example of applying the principle of FIG. 3.
Figure 6:
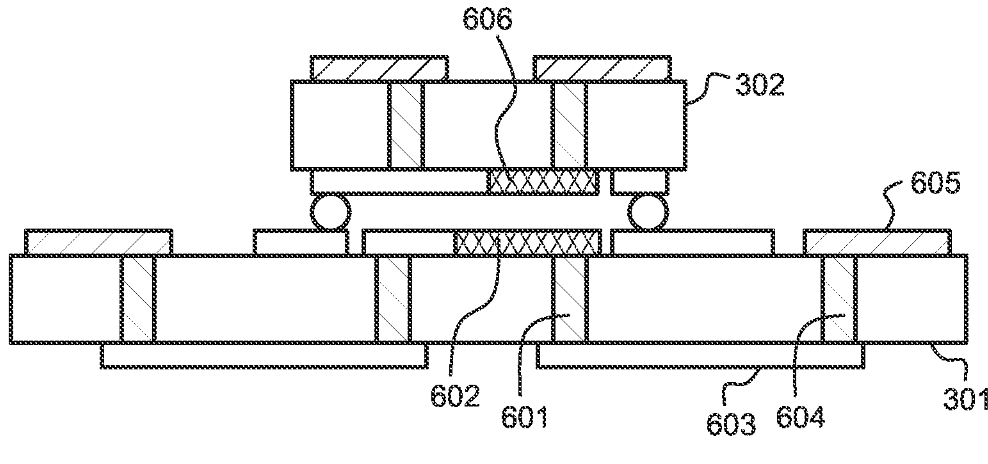
FIG. 6 illustrates another example of applying the principle of FIG. 3.

FIG. 4 illustrates a quantum computing circuit, according to one embodiment that follows the principle explained above with reference to FIG. 3. In FIGS. 4, 5, and 6, one of the chips (here the bottom chip 301) is a larger chip and the other (here the top chip 302) is a smaller chip that covers only a part of the larger chip in the flip-chip configuration. In FIG. 4, the larger chip 301 comprises at least one electrically conductive (or superconductive) contact pad 401 on that part of its surface facing the smaller chip 302 that is not covered by the smaller chip. Additionally, the larger chip 301 comprises a connection (referred to here as the first connection for unambiguous reference) that connects the contact pad 401 and a (first) galvanically conductive bonding bump 403. The first connection may comprise one or more conductive (or superconductive) patterns 402 on the surface of the larger chip 301.

Further in FIG. 4, the smaller chip 302 comprises a connection (referred to here as the second connection) that connects the first galvanically conductive bonding bump 403 and a first quantum circuit element 405 on the smaller chip. The second connection may include one or more conductive (or superconductive) patterns 404 on the surface of the smaller chip. In this manner, at least one conductive (or superconductive) contact pad 401 on the larger chip 301 constitutes a signal connection to the first quantum circuit element 405. The use of the preposition "to" does not limit the direction in which signals flow in the signal connection; it could also be called a connection "from" the first quantum circuit element 405.

The quantum computing circuit of FIG. 4 may involve a large variety of other connections and circuit elements. As examples, a further contact pad 406, further conductive (or superconductive) patterns 407, and a further quantum circuit element 408 are shown on the surface of the larger chip 301.

Implementations such as that in FIG. 4 enable the routing of signal lines, such as control and bias lines, for example, of the top chip 302 via bump bonds to the bottom chip 301, and making them accessible through contact pads so that connections to and from them can be made by other components. Also, the signal lines of the bottom chip 301 may be routed further out so that they are not covered by the smaller chip but become similarly accessible. This enables a straight-forward way of providing access for electrical and microwave signals to and from both chips after they have been bonded together.

FIG. 5 illustrates a quantum computing circuit, according to another embodiment that follows the principle explained above with reference to FIG. 3. Here the smaller chip (the top chip 302) comprises a second contact pad 501 on a surface that faces away from the larger chip (the bottom chip 301). The smaller chip comprises a third connection through a first conductive via 502, connecting the second contact pad 501 to a quantum circuit element 503 on the surface of the smaller chip facing the larger chip 301. Using one or more conductive vias (also known as TSVs or Through Silicon Vias) in the smaller chip 302 enables using the upper surface (the surface facing away from the larger chip 301) of the smaller chip for useful purposes, such as for contact pads, connections, and even quantum circuit elements. Another exemplary feature shown in FIG. 5 is the possibility of using non-conductive bonding bumps 504, at least at such locations where there is no need to make conductive connections between the two chips 301 and 302 in the flip-chip configuration. It should be noted that despite the reference to silicon in the term "through silicon via", the substrate of the chips may be other than silicon, such as sapphire for example.

The embodiment of FIG. 5 may enable routing even more signal lines on any or both chips 3010 and 302 to a central region, thus allowing more components to be integrated at the central region. It should be noted that while FIG. 5 does not show any quantum circuit elements or connections on the surface of the bottom chip 301 within the area covered by the top chip 302, such quantum circuit elements and connections could exist there. The approaches shown in FIGS. 4 and 5 may also be combined, for example, so that signal lines to some components on the top chip 302 go through contact pads on the bottom chip 301 and through conductive pads, while some other signal lines take routes through conductive vias in the top chip 302. It is also possible to route some signal lines to quantum circuit elements on the bottom chip 301 through contact pads on the top chip 302, through conductive vias in the top chip 302, and through conductive bonding bumps.

FIG. 6 illustrates a quantum computing circuit, according to another embodiment that follows the principle explained above with reference to FIG. 3. Here the larger chip (the bottom chip 301) comprises a second conductive via 601, connecting a third quantum circuit element 602 on that part of the surface of the larger chip facing the smaller chip that is covered by the smaller chip to a fourth connection that is at least partly located on a surface of the larger chip that faces away from the smaller chip 302. In the embodiment of FIG. 6, the fourth connection continues through a conductive (or superconductive) pattern 603 on the lower side of the bottom chip 301 to a further conductive via 604, and therethrough to a further contact pad 605 on the top side of the bottom chip 301.

As there are even more versatile ways of routing the connections and placing the circuit element in FIG. 6 than in the two preceding drawings, the embodiment of FIG. 6 may allow routing even more signal lines to the central region and/or integrating even more components to the central region.

As shown in FIG. 6, the top chip 302 is of the kind shown earlier in FIG. 5, i.e. one with conductive vias therethrough and with contact pads on its top surface offering access for signals to and from quantum circuit elements on its bottom side. The top chip 302 could also be of the kind shown earlier in FIG. 4. The approaches shown in FIGS. 4, 5, and 6 can be combined also in many other ways. Additionally there could be contact pads on the lower side of the bottom chip 301.

FIG. 6 shows also a further advantageous feature, according to which there may be one or more non-galvanic connections for conveying signals between the first and second chips 301 and 302. Such one or more non-galvanic connections may comprise matching non-galvanic connector structures on the surfaces of the first and second chips 301 and 302 facing each other. As an example, the quantum circuit element 602 shown in FIG. 6 on the bottom chip 301 may have a capacitive or inductive coupling to an opposite quantum circuit element 606 on the top chip 302. In general, the matching non-galvanic connector structures may comprise mutually aligned conductive areas on the surfaces of the first and second chips 301 and 302 facing each other for making a capacitive connection, and/or mutually aligned inductive elements for making a magnetic connection.

Figure 7:
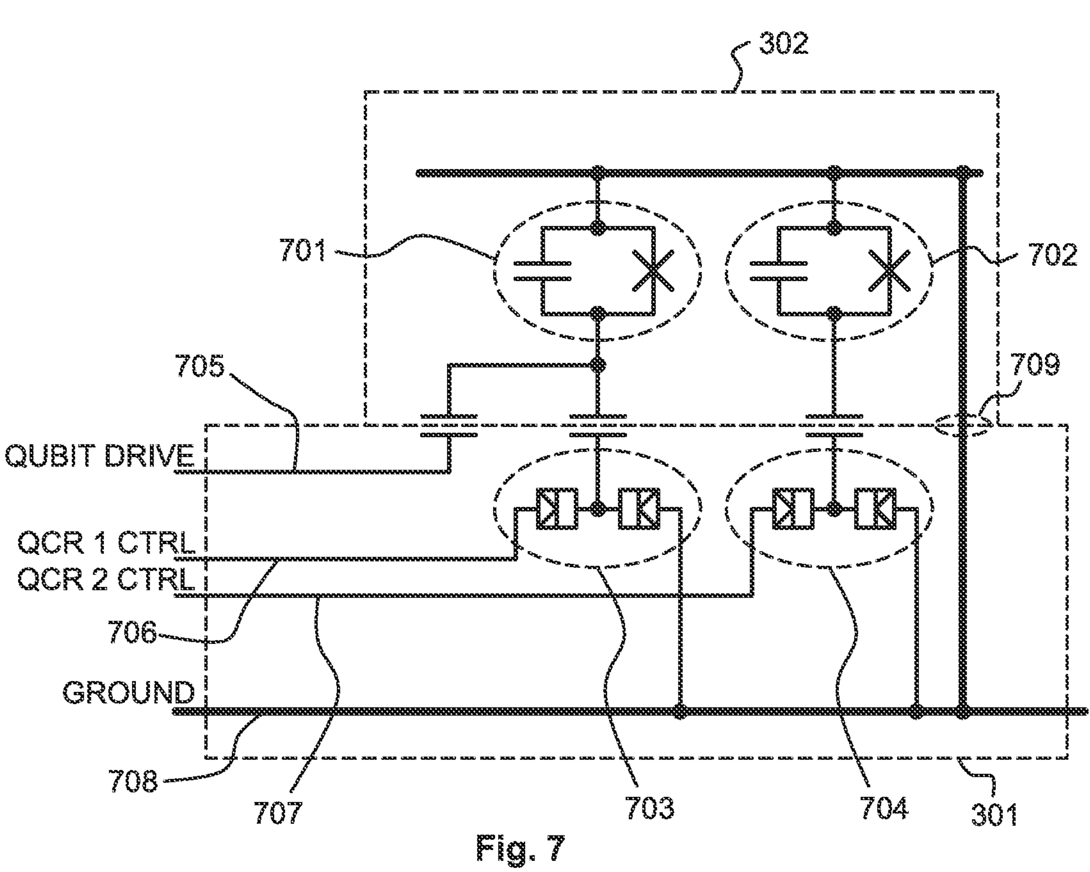
FIG. 7 illustrates couplings between circuit elements in a quantum computing circuit.

FIG. 7 shows a simplified circuit diagram of an example of a quantum computing circuit in which the top chip 302 comprises two qubits 701 and 702 and the bottom chip 301 comprises two QCRs 703 and 704 that can be used to reset the two qubits 701 and 702 respectively. Concerning the routing of signal lines, the embodiment shown in FIG. 7 follows the general approach taken in FIG. 4 above, in which also those signal lines that eventually are routed to quantum circuit elements in the top chip 302 come in through the bottom chip 301. One such signal line is shown, namely the signal line 705 that is used to drive the qubits 701 and 702. The two other signal lines 706 and 707 are used to control the operation of the QCRs 703 and 704 respectively. Additionally, there is a ground connection 708. Any suitable method can be used to make connections from the signal lines 705, 706, and 707, and ground connection 708 to other parts of the quantum computing device, including but not being limited to wire bonding.

A point 709 in the circuit diagram represents connecting the ground connection 708 between the two chips 301 and 302. The point 709 may take the form of a plurality of conductive (or superconductive) bonding bumps at a number of locations distributed around the ground planes on the surfaces of the chips facing each other. In general, it is advantageous to ensure that the grounding connection between the two chips is as effective as possible, for which purpose the use of a plurality of conductive (or superconductive) bonding bumps that interconnect a large number of ground plane points on the two chips is often recommended.

In the embodiment of FIG. 7, the couplings of signal lines between the two chips is capacitive, as is shown by the capacitor symbols at those locations where a signal line passes from one chip to another. These couplings may go through e.g. mutually aligned conductive areas on the surfaces of the two chips 301 and 302 facing each other. The capacitance of such capacitive couplings can be controlled by dimensioning the mutually aligned conductive areas. Additionally or alternatively, all non-galvanic signal couplings between circuit elements on the surfaces of the two chips 301 and 302 may be deliberately affected by controlling the flip-chip bonder so that during the bonding process it makes the final separating distance between the first and second chips assume a particular value selected for optimized non-galvanic signal coupling.

Many kinds of connectivity can be achieved between the two chips 301 and 302 by using some or all of the approaches described above. Such connectivity may include but is not limited to:

drive control lines and coupling elements (capacitors) for qubit driving, i.e. the RF or microwave lines for driving qubit transitions, readout control lines for passing the readout pulses across the qubit system, readout elements (resonators), and coupling elements for coupling the readout resonator to the readout control lines, connectivity to couple the qubits with each other with dedicated coupling elements,

- control lines and elements to control the qubit coupling,
- connectivity and coupling elements from reset circuitry such as QCRs to the qubits,
- reset control, such as QCR control lines for biasing and providing the reset pulses, and
- connectivity ensuring proper grounding within the system.

In preferred embodiments, the parts of the circuit including quantum coherent operation such as the qubits themselves, and the couplers including any connectivity between the qubit and couplers, is included on the qubit chip. As fabrication layers, the non-qubit chip can include normal metals, and possibly lossy dielectrics used for multi-layer structures for routing or potentially as filters that are on the non-qubit chip. In preferred embodiments, the non-qubit chip includes at least the reset circuitry, such as QCR devices themselves and the QCR control lines. In an embodiment, all connections to the qubit chip are performed by capacitive coupling, as shown in FIG. 7 (which shows just some connectivity and components as examples) apart from the grounding connection which is advantageously performed galvanically (by single or preferably multiple bump bonds forming the connection) for proper RF design. In principle, the capacitive connections can be at any part replaced by galvanic connections. A capacitive connection can also be implemented by placing the coupling capacitor on one of the chips entirely, followed by a galvanic connection from one of the capacitor plates to the other chip.

In some embodiments, in addition to or in place of galvanic and capacitive couplings one can use magnetic coupling by mutual inductance.

Different embodiments of methods according to the invention may comprise using different methodologies in fabricating the bump bonds such as evaporation or electroplating the bump material. The bump height defining the inter-chip distance can be tuned based on the specifications such as the implementation of the reactive (capacitive or mutual inductive) inter-chip coupling strengths, and spurious (unintentional) couplings between different elements. Furthermore, the distance can be tuned based on the requirement of electric fields coupling from the qubit chip to the non-qubit chip to avoid excessive losses due to fringing fields from the qubit chip into the potentially lossy materials of the non-qubit chip. Typical inter-chip distances can be in the range of 1-100 μm.

Figure 8:
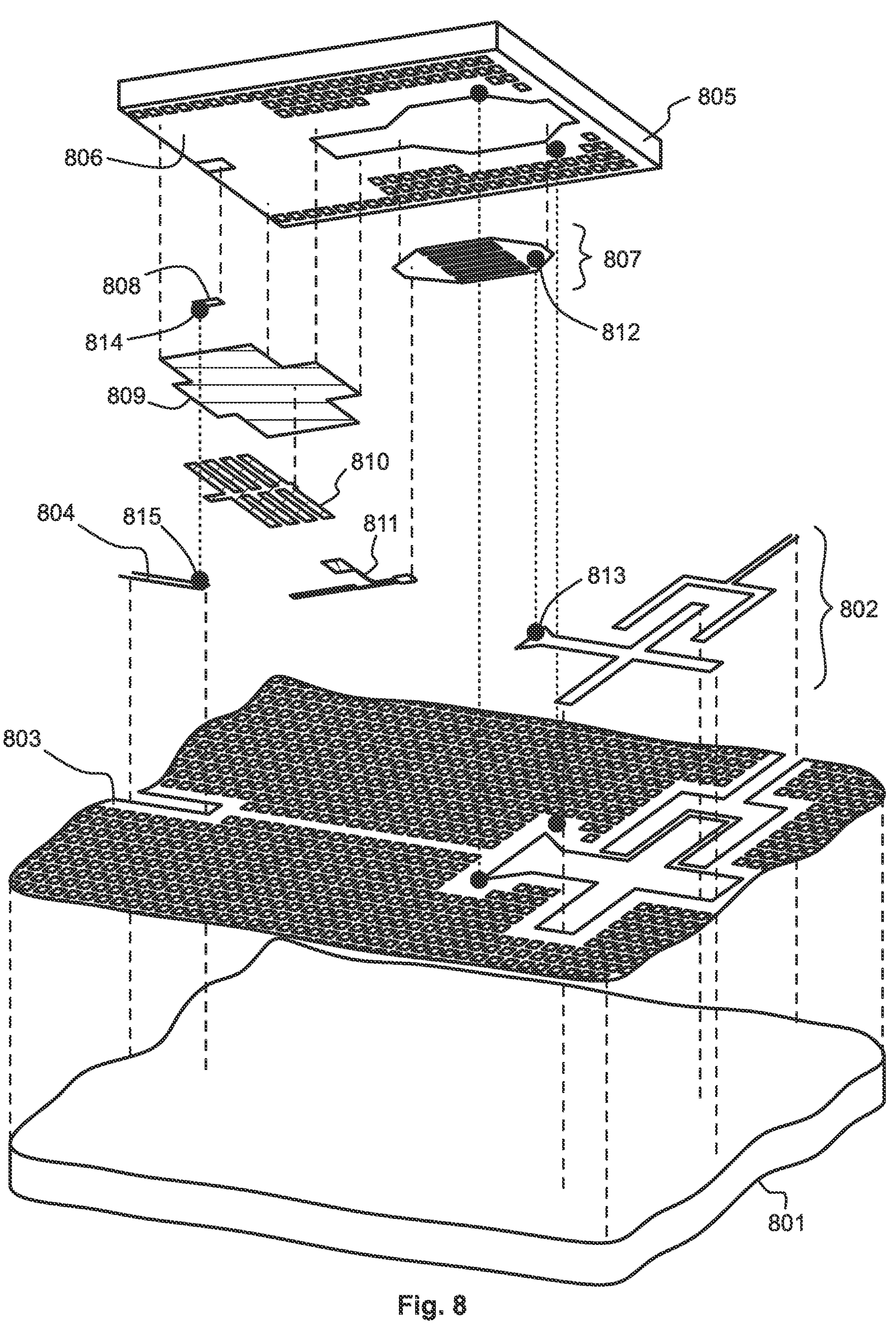
FIG. 8 illustrates an exploded view of an example of applying the principle of FIG. 3.

FIG. 8 illustrates a part of a quantum computing circuit, according to an embodiment of the invention in an exploded view. The quantum computing circuit includes a substrate 801 that constitutes a larger chip or bottom chip. The substrate 801 is also the qubit chip because superconductive patterns 802 that constitute a qubit are included thereon. A ground plane 803 covers a majority of the surface of the substrate 801. The example substrate 801 may also include other conductive or superconductive patterns such as transmission lines 804. A substrate 805 of another chip, which may be referred to as the top chip, the smaller chip, or the non-qubit chip, is shown at the top of the exploded view. The substrate 805 includes a ground plane 806 produced as a layer on a surface of the substrate 805 that faces the substrate 801.

Examples of patterns that are produced on the ground-plane-covered surface of the top chip substrate 805 include a pair of capacitive coupling elements 807, a short stub of a transmission line 808, a dielectric patch 809, a conductive (or superconductive) part 810 of a microwave filter, and a tunneling junction part 811 of a QCR with its associated contacts. In a completed configuration the QCR appears essentially the same as the QCR shown in FIGS. 1 and 2, with the microwave filter 810 connected between the transmission line 808 and the tunneling junction part 811 and isolated from the ground plane 806 of the top chip by the dielectric patch 809.

FIG. 8 shows some examples of places where bump bonding may be used between the two chips or substrates 801 and 805. In the drawing the locations of the bonding bumps are schematically shown with solid black circles on both sides for graphical clarity. At locations 812, 813, 814, and 815, bonding bumps are used to make galvanic connections to and from the QCR located on the top chip or substrate 805. At the other locations, bonding bumps are used to make galvanic connections between the ground planes of the two chips or substrates 801 and 805.

Figure 9:
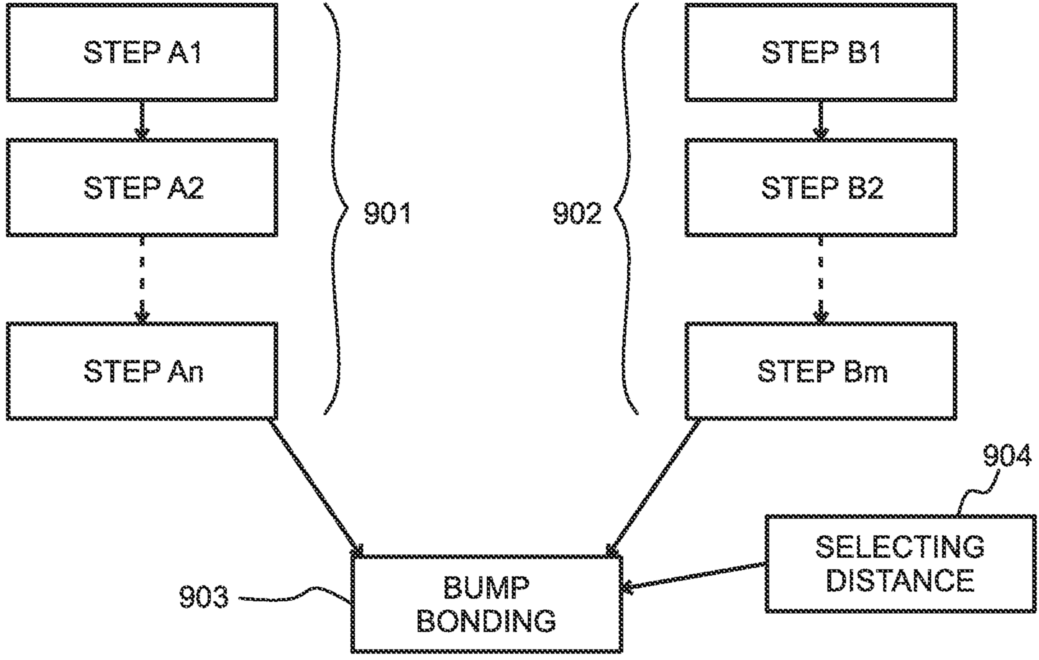
FIG. 9 illustrates a method according to an embodiment of the disclosure.

FIG. 9 illustrates schematically a method for producing a quantum computing circuit. Steps 901 comprise manufacturing a first chip and include, in one or more of the steps thereof, producing at least one qubit on the first chip. Steps 902 comprise manufacturing a second chip and producing at least one quantum circuit element other than a qubit on the second chip. Preferably steps 902 comprise manufacturing the second chip without producing any qubits on the second chip. Step 903 comprises bump bonding the first and second chips together into a stacked configuration. Bonding bumps may be used to attach the first and second chips to each other.

There is a difference between steps 901 and 902 in the disclosed method of FIG. 9. Steps 901 may comprise, for example, using a first set of constituent materials in manufacturing the first chip. Steps 902 may comprise using a second set of constituent materials in manufacturing the second chip. The first and second sets consist of at least partly different constituent materials that are optimized for the respective chips. In such an embodiment, at least one of the materials used in at least one of the steps 902 is incompatible with an optimized method of manufacturing high-quality qubits with long coherence time. Additionally or alternatively, the steps 901 may consist of a first sequence of manufacturing steps, and the steps 902 may consist of a second sequence of manufacturing steps, so that the first and second sequences are at least partly different sequences of manufacturing steps. In such an embodiment, the second sequence may comprise a manufacturing step that is incompatible with an optimized method of manufacturing high-quality qubits with long coherence time. Alternatively, the second sequence may lack one or more steps that are essential in an optimized method of manufacturing high-quality qubits with long coherence time.

As shown by step 904 in FIG. 9, the method may comprise making the bump bonding attach the first and second chips to each other at a separating distance selected for optimized non-galvanic signal coupling between circuit elements on the first and second chips.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. A quantum computing circuit comprising:

a first chip including at least one qubit;

a second chip including (i) a quantum circuit refrigerator comprising a superconductor-insulator-normal metal-insulator-superconductor (SINIS) junction and (ii) at least other quantum circuit elements other than qubits; and a controllable connection between the quantum circuit refrigerator and at least one qubit on the first chip, wherein the controllable connection enables the quantum circuit refrigerator to be controllably used to reset a state of the at least one qubit;

wherein the first chip and the second chip are stacked together in a flip-chip configuration and attached to each other via bump bonding that includes bonding bumps.

2. The quantum computing circuit according to claim 1, wherein:

the first chip is made of a first set of constituent materials, the second chip is made of a second set of constituent materials, and the first and second sets consist of at least partly different constituent materials.

3. The quantum computing circuit according to claim 2, wherein the second set of constituent materials includes at least one material that is not present in the first set of constituent materials and is one of aluminum oxide, copper, palladium, or another non-superconductive metal.

4. The quantum computing circuit according to claim 1, wherein:

the first chip is manufactured in a first manufacturing process that includes a first sequence of manufacturing steps, the second chip is manufactured in a second manufacturing process that includes a second sequence of manufacturing steps, and the first and second sequences are at least partly different sequences of manufacturing steps.

5. The quantum computing circuit according to claim 1, wherein at least some of the bonding bumps are galvanically conductive and constitute galvanically conductive contacts between the first and second chips.

6. The quantum computing circuit according to claim 1, wherein one of the first and second chips is a larger chip and the other of the first and second chips is a smaller chip that covers only a part of the larger chip in the flip-chip configuration.

7. The quantum computing circuit according to claim 6, wherein:

the larger chip includes at least a first contact pad on a part of its surface facing the smaller chip that is not covered by the smaller chip, the larger chip includes a first connection connecting the first contact pad and a first galvanically conductive bonding bump, and the smaller chip includes a second connection connecting the first galvanically conductive bonding bump and a first quantum circuit element on the smaller chip.

8. The quantum computing circuit according to claim 7, wherein the first contact pad constitutes a signal connection to the first quantum circuit element.

9. The quantum computing circuit according to claim 6, wherein the smaller chip includes a second contact pad on a surface that faces away from the larger chip, and the smaller chip includes a third connection through a first conductive via, the third connection connecting the second contact pad to a second quantum circuit element on the surface of the smaller chip facing the larger chip.

10. The quantum computing circuit according to claim 9, wherein the larger chip includes a second conductive via connecting a third quantum circuit element on the surface of the larger chip facing the smaller chip that is covered by the smaller chip to a fourth connection that is at least partly located on an opposing surface of the larger chip that faces away from the smaller chip.

11. The quantum computing circuit according to claim 1, further comprising a non-galvanic connection for conveying signals between the first and second chips, wherein the non-galvanic connection includes matching non-galvanic connector structures on surfaces of the first and second chips that face each other.

12. The quantum computing circuit according to claim 11, wherein the matching non-galvanic connector structures include mutually aligned conductive areas on the surfaces of the first and second chips facing each other for making a capacitive connection.

13. The quantum computing circuit according to claim 11, wherein the matching non-galvanic connector structures include mutually aligned inductive elements for making a magnetic connection.

14. The quantum computing circuit according to claim 1, wherein the second chip includes at least one filter that comprises at least one of: a non-superconductive metal, or a lossy dielectric.

15. The quantum computing circuit according to claim 1, wherein a separating distance between the first and second chips is between 1 and 100 micrometers.

* * * * *